US006063544A

United States Patent [19]

Sheriff et al.

[11] Patent Number: 6,063,544

[45] Date of Patent: *May 16, 2000

[54] POSITIVE-WORKING PRINTING PLATE AND METHOD OF PROVIDING A POSITIVE IMAGE THEREFROM USING LASER IMAGING

[75] Inventors: Eugene L. Sheriff, Johnstown; Ralph S. Schneebeli, Ft. Collins; Thomas R. Jordan, Windsor; Neil F. Haley, Wellington, all of Colo.

[73] Assignee: Kodak Polychrome Graphics LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/822,376

[22] Filed: Mar. 21, 1997

[51] Int. Cl.[7] .............................. G03F 7/004; G03F 7/09; G03F 7/30

[52] U.S. Cl. .................................... 430/271.1; 430/278.1; 430/302; 430/920; 430/926

[58] Field of Search ............................ 430/271.1, 278.1, 430/920, 926, 302

[56] References Cited

U.S. PATENT DOCUMENTS

| | | | |
|---|---|---|---|
| 2,766,118 | 10/1956 | Sus et al. | 95/7 |
| 2,767,092 | 10/1956 | Schmidt | 95/7 |
| 2,772,972 | 12/1956 | Herrick, Jr. et al. | 96/33 |
| 2,859,112 | 11/1958 | Sus et al. | 96/91 |
| 2,907,665 | 10/1959 | Fraher | 106/49 |
| 3,046,110 | 7/1962 | Schmidt | 96/33 |
| 3,046,111 | 7/1962 | Schmidt | 96/33 |
| 3,046,115 | 7/1962 | Schmidt et al. | 96/33 |
| 3,046,118 | 7/1962 | Schmidt | 96/33 |
| 3,046,119 | 7/1962 | Sus | 96/33 |
| 3,046,120 | 7/1962 | Schmidt et al. | 96/33 |
| 3,046,121 | 7/1962 | Schmidt | 96/33 |
| 3,046,122 | 7/1962 | Sus | 96/33 |
| 3,046,123 | 7/1962 | Sus et al. | 96/33 |
| 3,061,430 | 10/1962 | Uhlig et al. | 96/33 |
| 3,102,809 | 9/1963 | Endermann et al. | 96/33 |
| 3,105,465 | 10/1963 | Peters | 122/37 |
| 3,628,953 | 12/1971 | Brinckman et al. . | |
| 3,635,709 | 1/1972 | Kobayashi | 96/33 |
| 3,647,443 | 3/1972 | Rauner et al. | 96/33 |
| 3,837,860 | 9/1974 | Roos | 96/91 D |
| 3,859,099 | 1/1975 | Petropoulos et al. . | |
| 3,891,439 | 6/1975 | Katz et al. | 96/49 |
| 3,902,906 | 9/1975 | Iwama et al. | 96/115 R |
| 3,945,957 | 3/1976 | Noshiro et al. | 260/3.3 |
| 4,063,949 | 12/1977 | Uhlig et al. | 96/27 E |
| 4,132,168 | 1/1979 | Peterson | 101/471 |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takashi et al. | 430/296 |
| 4,493,884 | 1/1985 | Nagano et al. | 430/192 |
| 4,497,888 | 2/1985 | Nishioka et al. | 430/165 |
| 4,529,682 | 7/1985 | Toukhy | 430/190 |
| 4,544,627 | 10/1985 | Takashi et al. | 430/325 |
| 4,576,901 | 3/1986 | Stahlhofen et al. | 430/325 |

(List continued on next page.)

FOREIGN PATENT DOCUMENTS

| | | | |
|---|---|---|---|
| 0 304 313 | 2/1989 | European Pat. Off. . | |
| 0 327 998 | 8/1989 | European Pat. Off. . | |
| 0 343 986 | 11/1989 | European Pat. Off. . | |
| 0 375 838 | 4/1990 | European Pat. Off. . | |
| 0 366 590 | 5/1990 | European Pat. Off. . | |
| 0 390 038 | 1/1991 | European Pat. Off. . | |
| 0 410 606 | 1/1991 | European Pat. Off. . | |
| 0 424 182 | 4/1991 | European Pat. Off. . | |
| 0 458 485 | 11/1991 | European Pat. Off. . | |
| 0 517 428 | 12/1992 | European Pat. Off. . | |
| 0 519 128 | 12/1992 | European Pat. Off. . | |
| 0 519 591 | 12/1992 | European Pat. Off. . | |
| 0 534 324 | 3/1993 | European Pat. Off. . | |
| 0672954A2 | 3/1994 | European Pat. Off. | G03F 7/038 |
| 0 608 983 | 8/1994 | European Pat. Off. . | |
| 0 691 575 | 1/1996 | European Pat. Off. . | |
| 0 706 899 | 4/1996 | European Pat. Off. . | |
| 0 780 239 | 6/1997 | European Pat. Off. . | |
| 0 819 980 | 1/1998 | European Pat. Off. . | |
| 0 823 327 | 2/1998 | European Pat. Off. . | |
| 0 864 419 A1 | 2/1998 | European Pat. Off. . | |
| 0 864 491 | 9/1998 | European Pat. Off. . | |
| 0 867 278 | 9/1998 | European Pat. Off. . | |
| 0 894 622 | 2/1999 | European Pat. Off. . | |
| 4426820 | 2/1995 | Germany . | |
| 62-024241 | 2/1987 | Japan . | |
| 02010355 | 1/1990 | Japan . | |
| 207013 | 2/1995 | Japan . | |
| 07120928 | 5/1995 | Japan . | |
| 302722 | 5/1995 | Japan . | |
| 9264 | 6/1995 | Japan . | |
| 1066358 | 4/1967 | United Kingdom . | |
| 1170495 | 11/1969 | United Kingdom . | |
| 1231789 | 5/1971 | United Kingdom . | |
| 1245924 | 9/1971 | United Kingdom . | |
| 1546633 | 5/1979 | United Kingdom . | |
| 1563829 | 4/1980 | United Kingdom . | |
| 2082339A | 8/1980 | United Kingdom | G03C 1/52 |
| 1603920 | 12/1981 | United Kingdom . | |
| 86/02743 | 5/1986 | WIPO . | |
| 91/19227 | 12/1991 | WIPO . | |
| 93/06528 | 4/1993 | WIPO . | |
| 96/02491 | 2/1996 | WIPO . | |
| 97/39894 | 4/1996 | WIPO . | |
| 96/20429 | 7/1996 | WIPO . | |
| 9739894 | 10/1997 | WIPO . | |

OTHER PUBLICATIONS

"The Chemical Behavior of Positive Working Systems" by J.C. Strieter. Eastman Kodak Company, Rochester, New York. pp. 116–122.

*Primary Examiner*—John S. Chu

[57] ABSTRACT

A positive-working lithographic printing plate is used to provide a positive image without a post-exposure baking step and without any floodwise exposure steps. The printing plate includes an imaging layer that is imageable using an infrared radiation laser. The imaging layer consists essentially of a phenolic resin and an infrared radiation absorbing compound.

21 Claims, No Drawings

U.S. PATENT DOCUMENTS

| | | | |
|---|---|---|---|
| 4,609,615 | 9/1986 | Yamashita et al. | 430/325 |
| 4,684,599 | 8/1987 | Do Minh et al. | 430/270 |
| 4,693,958 | 9/1987 | Schwartz et al. . | |
| 4,708,925 | 11/1987 | Newman . | |
| 4,789,619 | 12/1988 | Ruckert et al. | 430/270 |
| 4,927,741 | 5/1990 | Garth et al. . | |
| 4,966,798 | 10/1990 | Brosius et al. . | |
| 5,002,853 | 3/1991 | Aoai et al. | 430/281 |
| 5,085,972 | 2/1992 | Vogel . | |
| 5,130,223 | 7/1992 | Nishimura et al. | 430/166 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/296 |
| 5,200,298 | 4/1993 | Takagi et al. | 430/264 |
| 5,202,221 | 4/1993 | Imai et al. | 430/283 |
| 5,208,135 | 5/1993 | Patel et al. | 430/281 |
| 5,227,473 | 7/1993 | Kawamura et al. | 534/557 |
| 5,279,918 | 1/1994 | Nishi et al. | 430/190 |
| 5,340,699 | 8/1994 | Haley et al. . | |
| 5,368,977 | 11/1994 | Yoda et al. | 430/190 |
| 5,372,907 | 12/1994 | Haley et al. . | |
| 5,372,915 | 12/1994 | Haley et al. . | |
| 5,372,917 | 12/1994 | Tsuchida et al. | 430/343 |
| 5,380,622 | 1/1995 | Roser | 430/343 |
| 5,437,952 | 8/1995 | Hirai et al. | 430/83 |
| 5,441,850 | 8/1995 | Marshall et al. | 430/336 |
| 5,466,557 | 11/1995 | Haley et al. . | |
| 5,491,046 | 2/1996 | DeBoer et al. . | |
| 5,631,119 | 5/1997 | Shinozaki | 430/326 |
| 5,641,608 | 6/1997 | Grunwald et al. | 430/302 |
| 5,658,708 | 8/1997 | Kondo | 430/288.1 |
| 5,705,308 | 1/1998 | West et al. | 430/165 |
| 5,705,309 | 1/1998 | West et al. | 430/167 |
| 5,705,322 | 1/1998 | West et al. | 430/325 |
| 5,725,994 | 3/1998 | Kondo | 430/270.1 |
| 5,731,123 | 3/1998 | Kawamura et al. | 430/176 |
| 5,741,619 | 4/1998 | Aoshima et al. | 430/175 |
| 5,759,742 | 6/1998 | West et al. | 430/278.1 |
| 5,786,125 | 7/1998 | Tsuchiya et al. | 430/372.1 |
| 5,840,467 | 11/1998 | Kitatani et al. | 430/302 |
| 5,858,626 | 1/1999 | Sheriff et al. | 430/326 |

POSITIVE-WORKING PRINTING PLATE AND METHOD OF PROVIDING A POSITIVE IMAGE THEREFROM USING LASER IMAGING

RELATED APPLICATIONS

U.S. Ser. No. 08/723,335 (filed Sep. 30, 1996, by West et al), and U.S. Ser. No. 08/723,176 (filed Sep. 30, 1996, by West et al).

FIELD OF THE INVENTION

This invention relates to a positive-working printing plate that is sensitive to infrared radiation. This invention also relates to a method of providing a positive image from this plate using laser imaging.

BACKGROUND OF THE INVENTION

The art of lithographic printing is based upon the immiscibility of oil and water, wherein the oily material or ink is preferentially retained by the image areas and the water or fountain solution is preferentially retained by the non-image areas. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become hardened so that non-image areas are removed in the developing process. Such a plate is referred to in the art as a negative-working printing plate. Conversely, when those portions of the coating that are exposed become soluble so that they are removed during development, the plate is referred to as a positive-working plate. In both instances, the image areas remaining are ink-receptive or oleophilic and the non-image areas or background are water-receptive or hydrophilic. The differentiation between image and non-image areas is made in the exposure process where a film is applied to the plate with a vacuum to insure good contact. The plate is then exposed to a light source, a portion of which is composed of UV radiation. In the instance of positive-working plates, the areas on the film corresponding to the image areas are darkened, preventing light from making those areas developer soluble, while the areas on the film corresponding to the non-image areas are clear, allowing them to become soluble. The soluble image areas can be removed during development. The non-image surfaces of a positive-working plate remain after development, are oleophilic and will accept ink while the image areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Direct digital imaging of offset printing plates is a technology that has assumed importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in several patents and published applications assigned to Presstek, Inc. [for example, U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

A higher speed and cleaner technology is described, for example, in U.S. Pat. No. 5,340,699 (Haley et al), U.S. Pat. No. 5,372,915 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates of U.S. Pat. No. 5,372,907 (noted above) comprise a resole resin, a novolac resin, a latent Bronsted acid and an infrared radiation absorbing compound. Other additives, such a various photosensitizers, may also be included.

DE-4,426,820 (Fuji) describes a printing plate that can be imaged in the near infrared at moderate power levels with relatively simple processing requirements. This printing plate has at least two layers: an imaging layer containing an o-diazoquinone compound and an infrared radiation absorbing compound, and a protective overcoat containing a water-soluble polymer or silicone polymer. This plate is floodwise exposed with ultraviolet light to convert the o-diazoquinone to an indenecarboxylic acid, which is then imagewise decarboxylated by means of heat transferred from the infrared radiation absorbing material. Development with an alkaline solution results in removal of areas not subjected to thermal decarboxylation. The pre-imaging floodwise exposure step, however, is awkward in that it precludes the direct loading of the printing plates into plate-setters.

Optical recording medium having laser imageable layers are described in U.S. Pat. No. 4,966,798 (Brosius et al). Such layers contain an infrared radiation absorbing dye or pigment in a phenolic resin, and are resident on a suitable polymeric support. Recordation is carried out using a laser to bring about a surface change in the imageable layer.

Printing plates are not the same type of materials and require a different imaging process.

Thus, there is a need for simple printing plates that can be easily imaged in the near infrared at moderate power levels and require relatively simple processing methods.

SUMMARY OF THE INVENTION

The present invention provides a lithographic printing plate comprising a support having thereon a laser-imageable positive-working imaging layer consisting essentially of a phenolic resin and an infrared radiation absorbing compound.

This invention also provides a method for providing a positive image consisting essentially of the steps of:

A) providing a lithographic printing plate comprising a support having thereon a laser-imageable positive-working imaging layer consisting essentially of a phenolic resin and an infrared radiation absorbing compound, B) imagewise exposing the printing plate with an infrared radiation emitting laser, and C) contacting the printing plate with an aqueous developing solution to remove the image areas.

The printing plates of this invention are useful for providing high quality digital positive images using moderately powered lasers. Since the printing plates of this invention are infrared radiation sensitive, digital imaging information can be conveniently utilized to form continuous or halftone positive images. The printing plate is simple, having only a single imaging layer that consists essentially of only two components: a phenolic resin and an infrared radiation absorbing compound. After laser imaging, conventional development is the only other step needed. No pre-imaging or post-imaging flood exposure, or post-imaging baking, step is necessary in the practice of this invention.

DETAILED DESCRIPTION OF THE INVENTION

As noted above, the positive-working imaging composition useful in this invention contains only two essential components a) and b):

a) a phenolic resin, and b) a compound that absorbs infrared radiation having a maximum wavelength greater than about 750 nm.

Some optional, but non-essential, components of the composition are described hereinbelow.

The resins useful in the practice of this invention include any resin having a reactive hydroxy group and being alkali soluble. The phenolic resins defined below are most preferred, but other resins include copolymers of acrylates and methacrylates with hydroxy-containing acrylates or methacrylates, as described for example in DE 2,364,178 (for example, a copolymer of hydroxyethyl methacrylate and methyl methacrylate).

The phenolic resins useful herein are light-stable, water-insoluble, alkali-soluble film-forming resins that have a multiplicity of hydroxy groups either on the backbone of the resin or on pendant groups. The resins typically have a molecular weight of at least about 350, and preferably of at least about 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin, and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Phenolic resins that are known as "resole resins", which are condensation products of bis-phenol A and formaldehyde, are also useful in this invention, although they are not preferred.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al) and U.S. Pat. No. 4,306,011 (Uehara et al) which are prepared by reacting a polyhydric alcohol and an aldehyde or ketone, several of which are described in the patents. Still other useful phenolic resins are described in U.S. Pat. No. 5,368,977 (Yoda et al).

A mixture of the resins described above can be used, as long as a mixture of a novolac resin and a resole resin are not used. Thus, such mixtures are excluded from the imaging composition of this invention. Preferably, a single novolac resin is present in the imaging composition of this invention.

When the imaging composition of this invention is formulated as a coating composition in suitable coating solvents, the resin is present in an amount of at least 0.5 weight percent. Preferably, it is present in an amount of from about 1 to about 10 weight percent.

In the dried imaging layer of the element of this invention, the resin is the predominant material. Generally, it comprises at least 50 weight percent of the layer, and more preferably, it is from about 60 to about 88 weight percent of the dried layer.

The second essential component of the imaging composition of this invention is an infrared radiation absorbing compound, or mixture thereof. Such compounds typically have a maximum absorption wavelength ($D_{max}$) in the region of at least about 750 nm, that is in the infrared and near infrared regions of the spectrum, and more particularly, within from about 800 to about 1100 nm. The compounds can be dyes or pigments, and a wide range of compounds are well known in the art. Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful infrared radiation absorbing dyes are of the cyanine class.

The amount of infrared radiation absorbing compound in the dried imaging layer is generally sufficient to provide an optical density of at least 0.5 in the layer, and preferably, an optical density of from about 1 to about 3. This range would accommodate a wide variety of compounds having vastly different extinction coefficients. Generally, this is at least 1 weight percent, and preferably from 5 to 25 weight percent.

It is critical that the weight ratio of component b (infrared radiation absorbing compound) to phenolic resin is at least 1:7, and preferably at least 2:7. Higher ratios may be useful, but at some point, the composition will have too little resin to provide a suitable imaging composition with excellent wearability. The optimum ratio will depend upon the phenolic resin being used and can be determined using routine experimentation.

Optional, non-essential components of the imaging composition include colorants, sensitizers, stabilizers, exposure indicators and surfactants in conventional amounts.

Obviously, the imaging composition is coated out of one or more suitable organic solvents that have no effect on the sensitivity of the composition. Various solvents for this purpose are well known, but acetone and 1-methoxy-2-propanol are preferred. Mixtures can be used, if desired. The essential components of the composition are dissolved in the solvents in suitable proportions to provide the desired dry amounts.

Suitable conditions for drying the imaging composition involve heating for a period of time of from about 0.5 to about 5 minutes at a temperature in the range of from about 20 to about 150° C.

To form a printing plate of this invention, the imaging composition is applied (usually by coating techniques) onto a suitable support, such as a metal sheet, polymeric film (such as a polyester), ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet, that can be further treated with an acrylamide-vinylphosphonic acid copolymer according to the teaching in U.S. Pat. No. 5,368,974 (Walls et al). Such elements are generally known as lithographic printing plates, but other useful elements include printed circuit boards.

The thickness of the resulting positive-working imaging layer, after drying, on the support can vary widely, but typically it is in the range of from about 0.5 to about 2 $\mu$m, and preferably from about 1 to about 1.5 $\mu$m.

No other essential layers are provided in the printing plate of this invention. In particular, there are no protective or other type of layers over the imaging layer. Optional, but not preferred subbing or antihalation layers can be disposed under the imaging layer, or on the backside of the support (such as when the support is a transparent polymeric film).

The printing plates of this invention are uniquely adapted for "direct-to-plate" imaging applications. Such systems utilize digitized image information, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed printing plate. Thus, no exposed and processed films are needed for imaging of the plates, as in the conventional lithographic imaging processes.

Laser imaging can be carried out using any moderate or high-intensity laser diode writing device. Specifically, a laser printing apparatus is provided that includes a mechanism for scanning the write beam across the plate to generate an image without ablation. The intensity of the write beam generated at the laser diode source at the element is at least about 10 milliwatts/cm$^2$. During operation, the plate to be exposed is placed in the retaining mechanism of the writing device and the write beam is scanned across the plate to generate an image.

Following laser imaging, the printing plate of this invention is then developed in an alkaline developer solution until the image areas are removed to provide the desired positive image. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK Production Series Machine Developer/Positive.

After development, the plate can be treated with a finisher such as gum arabic, if desired. However, after imaging, the plate is subjected to no other essential steps, except development. Thus, no post-imaging bake step is carried out, nor is floodwise exposure needed before or after imaging.

The following examples are provided to illustrate the practice of this invention, and not to limit it in any manner. Unless otherwise noted, all percentages are by weight.

EXAMPLES 1 AND 2

Imaging coating formulations were prepared as follows:

Imaging coating formulations were prepared as follows:

| | PARTS | |
|---|---|---|
| COMPONENT | Example 1 | Example 2 |
| Cresol-formaldehyde novolak resin (from Schenectady Chemical Co.) | 7.0 | 0 |
| Polyhydroxy styrene (from Hoechst-Celanese) | 0 | 7.0 |
| 2-[2-[2-chloro-3-[(1,3-dihydro-1,1,3-trimethyl-2H-benz[e]indol-2-ylidene)ethylidene-1-cyclohexen-1-yl]ethenyl]-1,1,3-trimethyl-1H-benz[e]indolium, salt with 4-methylbenzenesulfonic acid as IR radiation absorbing dye | 1.0 | 2.0 |
| 1-Methoxy-2-propanol solvent | 141.0 | 141.0 |

The formulations were applied to give a dry coating weight of about 1 g/m$^2$ onto electrochemically grained and sulfuric acid anodized aluminum sheets that had been further treated with an acrylamide-vinylphosphonic acid copolymer (according to U.S. Pat. No. 5,368,974, noted above) to form unexposed lithographic printing plates.

The plates were imaged with a 500 milliwatt diode laser emitting a modulated pulse centered at 830 nm, and processed with KODAK Production Series Machine Developer/Positive to provide a high resolution positive images. Fine highlight dots were retained.

The invention has been described in detail with particular reference to preferred embodiments thereof, but it will be understood that variations and modifications can be effected within the spirit and scope of the invention.

We claim:

1. A lithographic printing plate comprising a lithographic printing plate support having thereon a laser-imageable positive-working imaging layer consisting of a phenolic resin and an infrared radiation absorbing compound; and optionally a colorant, an exposure indicator, a surfactant, or combinations thereof.

2. The printing plate of claim 1 wherein said phenolic resin is a novolac resin.

3. The printing plate of claim 2 wherein said phenolic resin is a cresol-formaldehyde resin.

4. The printing plate of claim 1 wherein said phenolic resin is a poly(hydroxystyrene).

5. The printing plate of claim 1 wherein said infrared radiation absorbing compound is a squarylium, croconate, cyanine, merocyanine, indolizine, pyrylium or metal dithiolene dye or pigment that absorbs infrared radiation at a wavelength of from about 800 to about 1100 nm.

6. The printing plate of claim 1 wherein said infrared radiation absorbing compound is present in an amount sufficient to provide an optical density of at least 0.5.

7. The printing plate of claim 6 wherein said infrared radiation absorbing compound is present in an amount sufficient to provide an optical density of from about 1 to about 3.

8. The printing plate of claim 1 wherein said support is a grained and anodized aluminum support.

9. The printing plate of claim 1 wherein said support is a polyester support.

10. The printing plate of claim 1 wherein said laser-imageable positive-working imaging layer is the sole radiation-sensitive layer.

11. The printing plate of claim 1 wherein the weight ratio of said infrared radiation absorbing compound to said phenolic resin is at least 1:7.

12. The printing plate of claim 11 wherein said weight ratio is at least 2:7.

13. A method for providing a positive image consisting essentially of the steps of:

A) providing a lithographic printing plate comprising a lithographic printing plate support having thereon a laser-imageable positive-working imaging layer consisting of a phenolic resin and an infrared radiation absorbing compound, and optionally a colorant, an exposure indicator, a surfactant, or combinations thereof, B) imagewise exposing said printing plate with an infrared radiation emitting laser, and C) contacting said printing plate with an aqueous developing solution to remove the image areas.

14. The method of claim 13 wherein said phenolic resin is a novolac resin.

15. The method of claim 13 wherein said infrared radiation absorbing compound is a squarylium, croconate, cyanine, merocyanine, indolizine, pyrylium or metal dithiolene dye or pigment that absorbs infrared radiation at a wavelength of from about 800 to about 1100 nm, and present in an amount sufficient to provide an optical density of at least 0.5.

16. The method of claim 13 wherein said support is a polyester support.

17. The method of claim 13 wherein said support is a metal support.

18. The method of claim 17 wherein said support is a grained and anodized aluminum support.

19. The method of claim 10 wherein said laser-imageable positive-working imaging layer is the sole radiation-sensitive layer.

20. The method of claim 10 wherein the weight ratio of said infrared radiation absorbing compound to said phenolic resin is at least 1:7.

21. The printing plate of claim 1 wherein the infrared radiation absorbing compound is selected from a group of dyes or pigments consisting of squarylium, croconate, cyanine, phthalocyanine, merocyanine, chalcogenopyryloarylidene, oxyindolizine, quinoid, indolizine, pyrylium, metal dithiolene, thiazine, azulenium, xanthene, and combinations thereof; and optionally a colorant, an exposure indicator, a surfactant, or combinations thereof.

* * * * *